US012283900B2

(12) United States Patent
Chang et al.

(10) Patent No.: US 12,283,900 B2
(45) Date of Patent: Apr. 22, 2025

(54) FLEXIBLE ACTUATOR FOR CURVED SURFACE AND CONTROL METHOD THEREOF

(71) Applicants: Hyundai Motor Company, Seoul (KR); Kia Corporation, Seoul (KR); Korea Advanced Institute of Science and Technology, Daejeon (KR)

(72) Inventors: Kyoung Jin Chang, Suwon-si (KR); Dong Chul Park, Anyang-si (KR); Ki Uk Kyung, Daejeon (KR); Hyun Woo Kim, Daejeon (KR); Min Ki Kim, Daejeon (KR); Jong Seok Nam, Daejeon (KR); Ji Hyeong Ma, Daejeon (KR)

(73) Assignees: HYUNDAI MOTOR COMPANY, Seoul (KR); KIA CORPORATION, Seoul (KR); KOREA ADVANCED INSTITUTE OF SCIENCE AND TECHNOLOGY, Seoul (KR)

( * ) Notice: Subject to any disclaimer, the term of this patent is extended or adjusted under 35 U.S.C. 154(b) by 263 days.

(21) Appl. No.: 17/967,082

(22) Filed: Oct. 17, 2022

(65) Prior Publication Data
US 2023/0163700 A1    May 25, 2023

(30) Foreign Application Priority Data

Nov. 25, 2021   (KR) .................. 10-2021-0164716

(51) Int. Cl.
*H02N 1/00*       (2006.01)
*H10N 30/20*     (2023.01)
*H10N 30/857*   (2023.01)

(52) U.S. Cl.
CPC .................... *H02N 1/002* (2013.01)

(58) Field of Classification Search
CPC ....... H10N 30/20; H10N 30/704; H02N 1/002
See application file for complete search history.

(56) References Cited

U.S. PATENT DOCUMENTS

| | | | |
|---|---|---|---|
| 6,376,971 B1 * | 4/2002 | Pelrine | H04R 5/02 977/788 |
| 6,496,348 B2 * | 12/2002 | McIntosh | G01L 9/0075 361/115 |
| 7,921,541 B2 | 4/2011 | Pei et al. | |
| 8,755,124 B2 * | 6/2014 | Aschwanden | G02B 26/004 359/666 |
| 10,746,206 B1 * | 8/2020 | Rowe | F15B 21/065 |
| 11,370,653 B2 * | 6/2022 | Liu | G06F 3/016 |
| 11,467,669 B2 * | 10/2022 | Liu | G06F 3/044 |
| 2021/0091682 A1 * | 3/2021 | Jiang | H02N 1/006 |

FOREIGN PATENT DOCUMENTS

| | | |
|---|---|---|
| JP | 2009-027065 A | 2/2009 |
| KR | 10-1175043 B1 | 8/2012 |
| KR | 10-2014-0109002 A | 9/2014 |
| KR | 10-1526043 B1 | 6/2015 |
| KR | 10-1529606 B1 | 6/2015 |
| KR | 10-1761055 B1 | 7/2017 |
| KR | 10-2021-0086518 A | 7/2021 |

* cited by examiner

*Primary Examiner* — Burton S Mullins
(74) *Attorney, Agent, or Firm* — Morgan, Lewis & Bockius LLP

(57) ABSTRACT

A flexible actuator for curved surfaces and a control method thereof is used for curved surfaces and generates high vibration using a relatively low voltage.

14 Claims, 7 Drawing Sheets

220

FLEXIBLE ACTUATOR FOR CURVED SURFACE AND CONTROL METHOD THEREOF

CROSS REFERENCE TO RELATED APPLICATION

The present application claims priority to Korean Patent Application No. 10-2021-0164716, filed Nov. 25, 2021, the entire contents of which is incorporated herein for all purposes by this reference.

BACKGROUND OF THE PRESENT DISCLOSURE

Field of the Present Disclosure

The present disclosure relates to a flexible actuator, and more particularly, to a flexible actuator for curved surfaces and a control method thereof, the flexible actuator being configured to be used for curved surfaces and to generate high vibration using a relatively low voltage.

Description of Related Art

In general, for actuators capable of providing the feeling of vibration, an eccentric rotating mass vibration motor and a linear resonance actuator are representative. Other technologies using a piezoelectric material may also be used to provide the feeling of vibration. For example, technologies using the piezoelectric material include a technology of disposing a piezoelectric polymer layer between two layers and causing a physical change in the piezoelectric polymer to generate vibration. A vibrator using a piezoelectric material may have an uncomfortable tactile sensation due to foreign body feeling of the piezoelectric material.

Thus, to reduce such foreign body feeling or uncomfortable sensation, an actuator using an electroactive polymer (EAP) has been used. The electroactive polymer is a polymer capable of repeatedly perform expansion, contraction, and bending in response to electrical stimulation. A mechanical movement may be obtained by applying electrical stimulation to the electroactive polymer and electricity may be obtained by applying mechanical stimulation to the electroactive polymer. Accordingly, the electroactive polymer is used as a material highly applicable for an actuator and a detector.

However, in a related-art actuator using an electroactive polymer, a physical shape change starts from a peripheral portion corresponding to an external portion of the actuator. A relatively large angle is formed between an electroactive polymer composite film and an electrode. Consequently, driving at higher frequencies may be difficult and thus the magnitude of vibration may be limited.

Furthermore, there is another problem in that it is difficult to apply a flexible actuator of the related art to a curved surface.

Accordingly, there is demand for a technology for a flexible actuator able to be applied to a curved surface, minimize uncomfortable sensation or foreign body feeling, and adjust frequency in a wide range to transfer various feelings of vibration.

The information included in this Background of the present disclosure section is only for enhancement of understanding of the general background of the present disclosure and may not be taken as an acknowledgement or any form of suggestion that this information forms the prior art already known to a person skilled in the art.

BRIEF SUMMARY

Various aspects of the present disclosure are directed to providing a flexible actuator for curved surfaces, wherein the flexible actuator may be fabricated in a thin curved surface shape to be applied to a curved surface.

Furthermore, the present disclosure is also intended to propose a flexible actuator for curved surfaces and a control method thereof, wherein the actuator and method may change the amplitude, frequency, or the like of vibration in a wide range to provide various of feelings of vibration to a user and provide a high vibration output using a relatively low voltage.

In various aspects of the present disclosure, there is provided a flexible actuator for curved surfaces, the flexible actuator including: a substrate layer having a curved shape; an electroactive polymer composite film covering the substrate layer and having a curved shape, wherein peripheral portions of the electroactive polymer composite film are joined with peripheral portions of the substrate layer, and the electroactive polymer composite film includes an electroactive polymer layer and a flexible electrode layer; an electrode disposed between the substrate layer and the electroactive polymer composite film; and a dielectric fluid injected between the electroactive polymer composite film and the electrode. The electroactive polymer composite film and the electrode may be configured so that a distance between center portions of the electroactive polymer composite film and the electrode is smaller than a distance between peripheral portions of the electroactive polymer composite film and the electrode.

The electroactive polymer composite film may be configured to change a physical shape thereof by pushing the dielectric fluid in a direction toward the peripheral portions of the electroactive polymer composite film as the flexible electrode layer and the electrode are brought into contact in a direction from the center portions to the peripheral portions due to electrostatic attraction between the flexible electrode layer and the electrode when a voltage is applied.

Furthermore, the electroactive polymer composite film and the electrode may define a predetermined angle from the center, the angle being minimized by the curvature of the substrate layer.

The electroactive polymer composite film may use a material generating surface charge induction to improve electrostatic attraction.

The electrode may be a flexible electrode depending on a degree of flexibility of the substrate layer. The flexible electrode layer may be internally disposed within a body of the electroactive polymer layer to be insulated from an external environment.

The flexible actuator may further include a control circuit, wherein the control circuit includes: a power supply portion; a high voltage converter configured for converting a current into a current having a voltage higher than a predetermined voltage; a controller configured for selecting a target signal at a predetermined current level; and a high voltage switching element configured for switching a high-voltage current signal at a rate of several microseconds in response to the target signal. A negative electrode and a positive electrode of the power supply portion may be connected sequentially to the high voltage converter and the high voltage switching element and then to the flexible electrode layer and the electrode through corresponding cables.

In the meantime, at least one of the flexible actuator for the curved surfaces may be applied to a steering wheel.

Also provided is a method of controlling a flexible actuator for curved surfaces, the method including: generating electrostatic attraction between a flexible electrode layer of an electroactive polymer composite film and an electrode when power is supplied thereto; and pushing a dielectric fluid toward a peripheral portion, changing a physical shape, as contact between the electroactive polymer composite film and the electrode spreads in a direction from a center portion thereof to a periphery thereof.

The generation of the electrostatic attraction may include forming a predetermined angle between the electroactive polymer composite film and the electrode at a center portion. The angle may be minimized due to the curvature of the substrate layer, and the electrostatic attraction may be increased with decreases in a distance between the flexible electrode layer and the electrode.

Furthermore, the generation of the electrostatic attraction may include increasing the electrostatic attraction by forming the electroactive polymer composite film of a material capable of easily generating surface charge induction.

The method may further include generating vibration supplying power that varies over time. The generation of the electrostatic attraction may include switching, by a high-voltage switching element of a control circuit, a high-voltage current signal to a target signal selected by a microcontroller, allowing the electroactive polymer composite film to be rapidly contracted and expanded.

In the flexible actuator for the curved surfaces and the control method thereof according to an exemplary embodiment of the present disclosure, the angle defined between the electroactive polymer composite film and the electrode is minimized, and thus the flexible actuator may operate at a high frequency, generate greater vibration at a relatively low voltage.

Furthermore, the present disclosure may be applied to a curved shape while minimizing foreign body feeling and uncomfortable feeling. When applied to a curved surface display, a steering wheel, or the like, the present disclosure may not only transfer various types of information by haptic feedback but also generate vibration in association with music.

The methods and apparatuses of the present disclosure have other features and advantages which will be apparent from or are set forth in more detail in the accompanying drawings, which are incorporated herein, and the following Detailed Description, which together serve to explain certain principles of the present disclosure.

Figure 1:
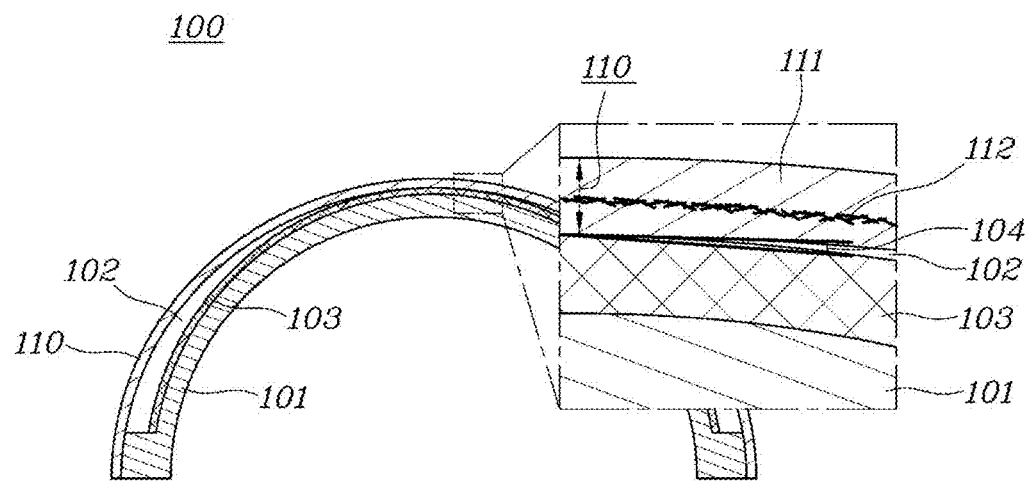
FIG. 1 is a cross-sectional view exemplarily illustrating the structure of a flexible actuator for curved surfaces according to an exemplary embodiment of the present disclosure.

It may be understood that the appended drawings are not necessarily to scale, presenting a somewhat simplified representation of various features illustrative of the basic principles of the present disclosure. The specific design features of the present disclosure as disclosed herein, including, for example, specific dimensions, orientations, locations, and shapes will be determined in part by the particularly intended application and use environment.

In the figures, reference numbers refer to the same or equivalent parts of the present disclosure throughout the several figures of the drawing.

DETAILED DESCRIPTION

Reference will now be made in detail to various embodiments of the present disclosure(s), examples of which are illustrated in the accompanying drawings and described below. While the present disclosure(s) will be described in conjunction with exemplary embodiments of the present disclosure, it will be understood that the present description is not intended to limit the present disclosure(s) to those exemplary embodiments of the present disclosure. On the other hand, the present disclosure(s) is/are intended to cover not only the exemplary embodiments of the present disclosure, but also various alternatives, modifications, equivalents and other embodiments, which may be included within the spirit and scope of the present disclosure as defined by the appended claims.

Figure 2A:
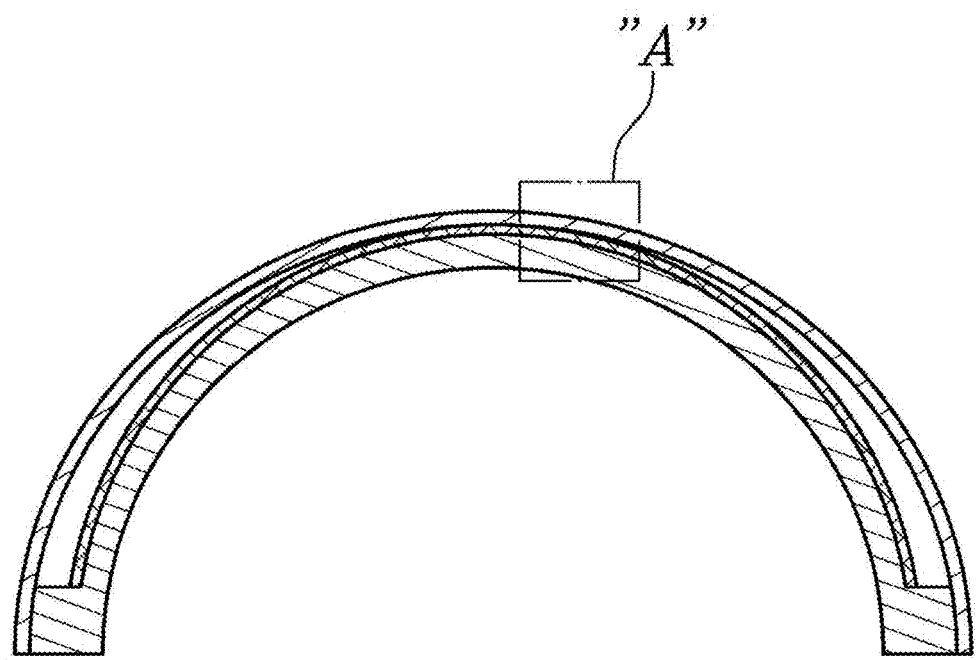
FIG. 2A and FIG. 2B are conceptual views exemplarily illustrating the operations of the flexible actuator according to an exemplary embodiment of the present disclosure before and after a voltage is applied.
Figure 2B:
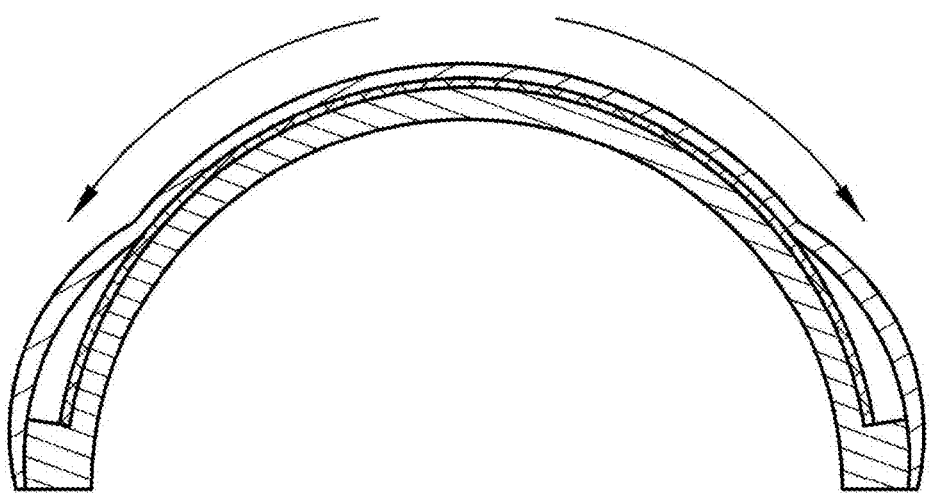
Figure 3:
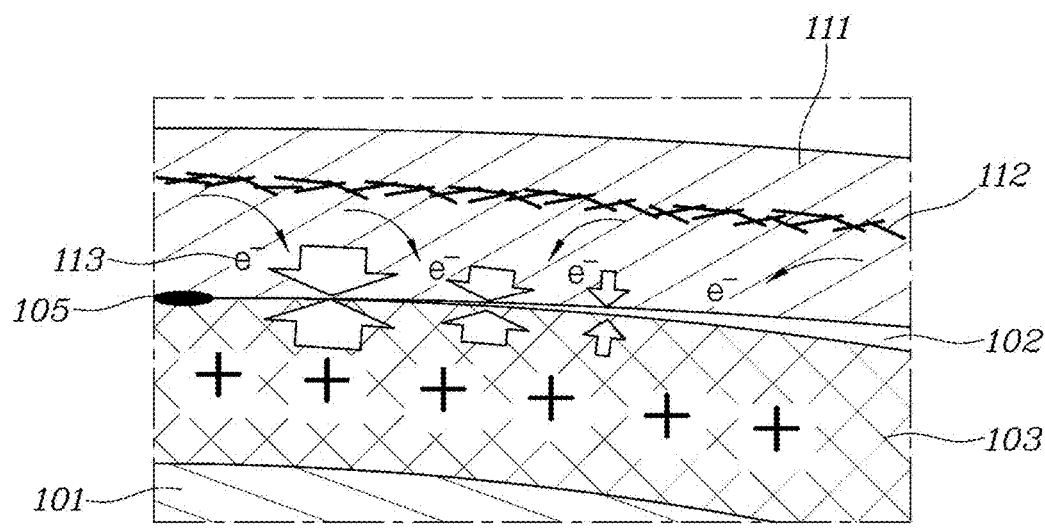
FIG. 3 is an enlarged view of the portion "A" in FIG. 2.
Figure 4:
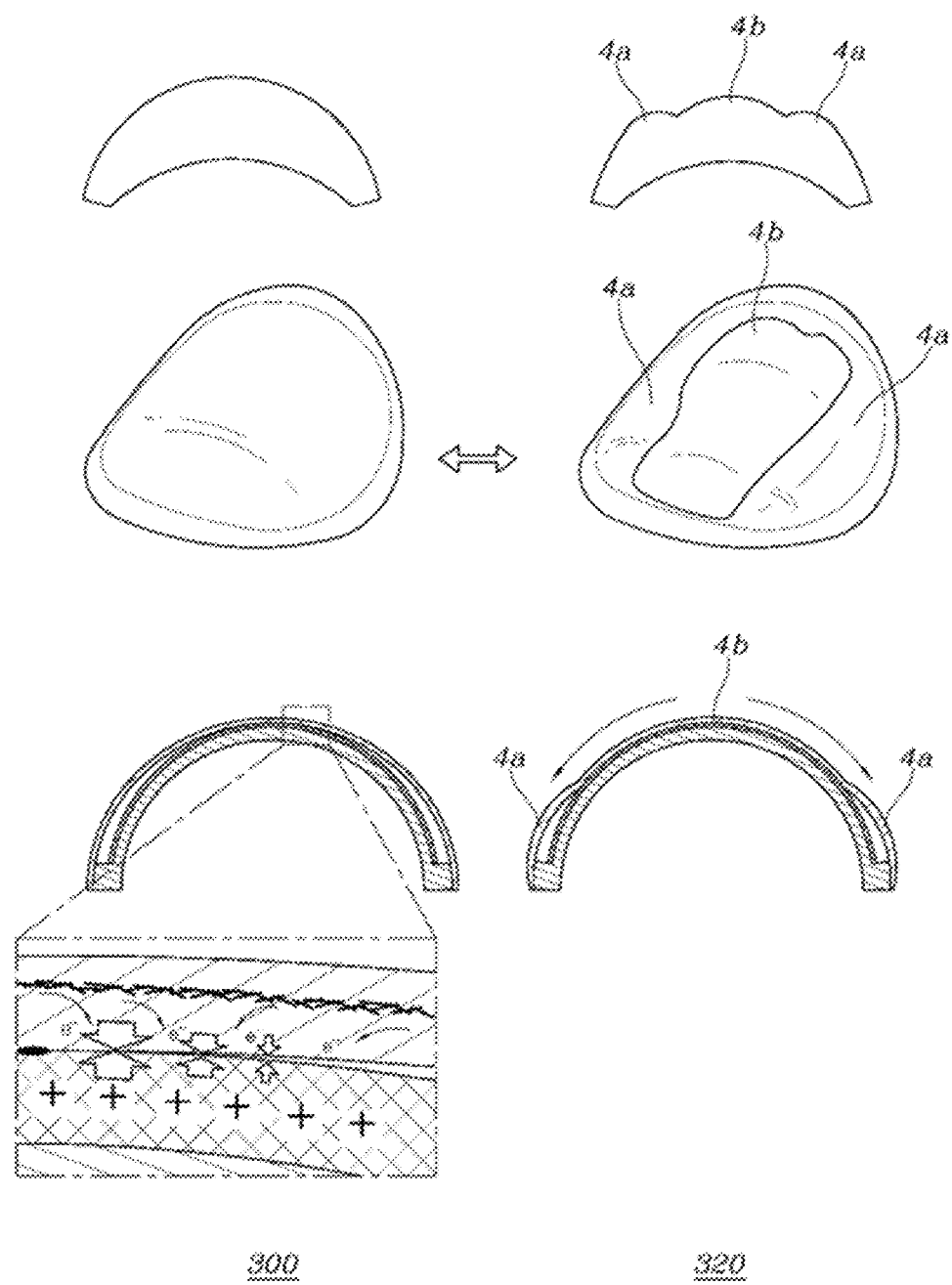
FIG. 4 is a three-dimensional view exemplarily illustrating operation states before and after power is applied according to an exemplary embodiment of the present disclosure.
Figure 5:
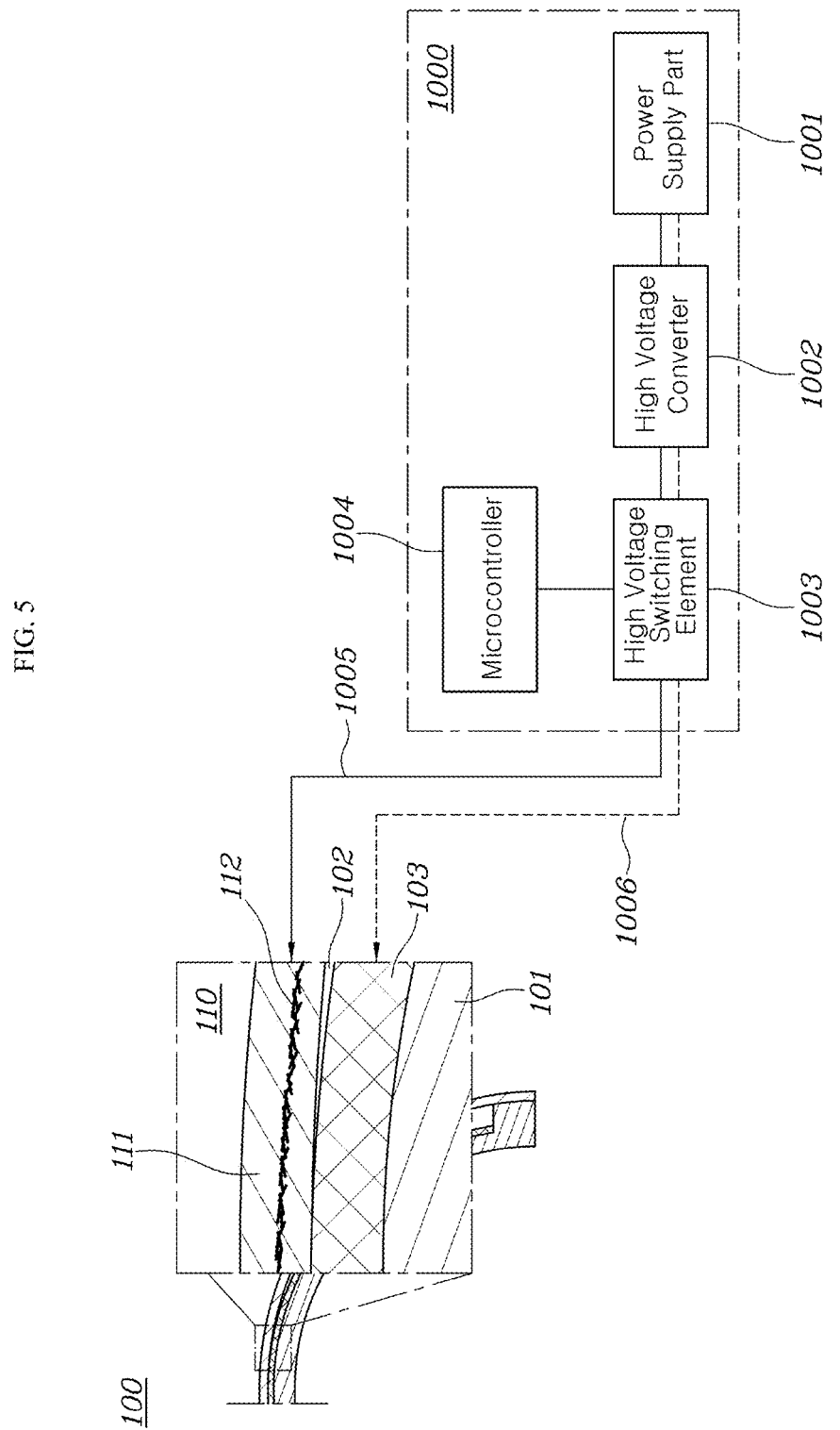
FIG. 5 is a view exemplarily illustrating the configuration of the flexible actuator for the curved surfaces and a control circuit thereof.
Figure 6A:
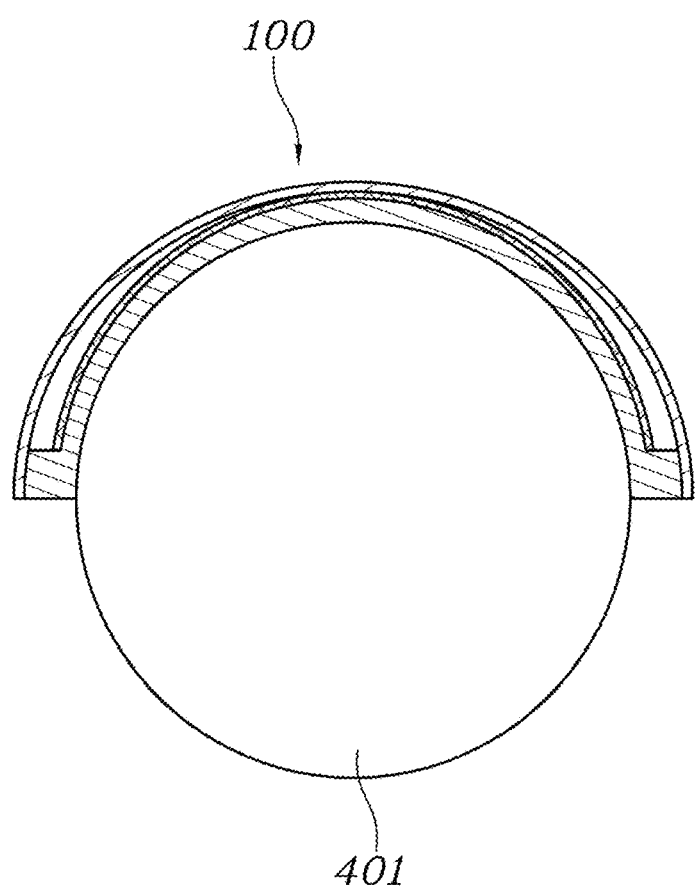
FIG. 6A and FIG. 6B are conceptual views exemplarily illustrating an exemplary embodiment in which the flexible actuator for the curved surfaces is applied to a steering wheel.
Figure 6B:
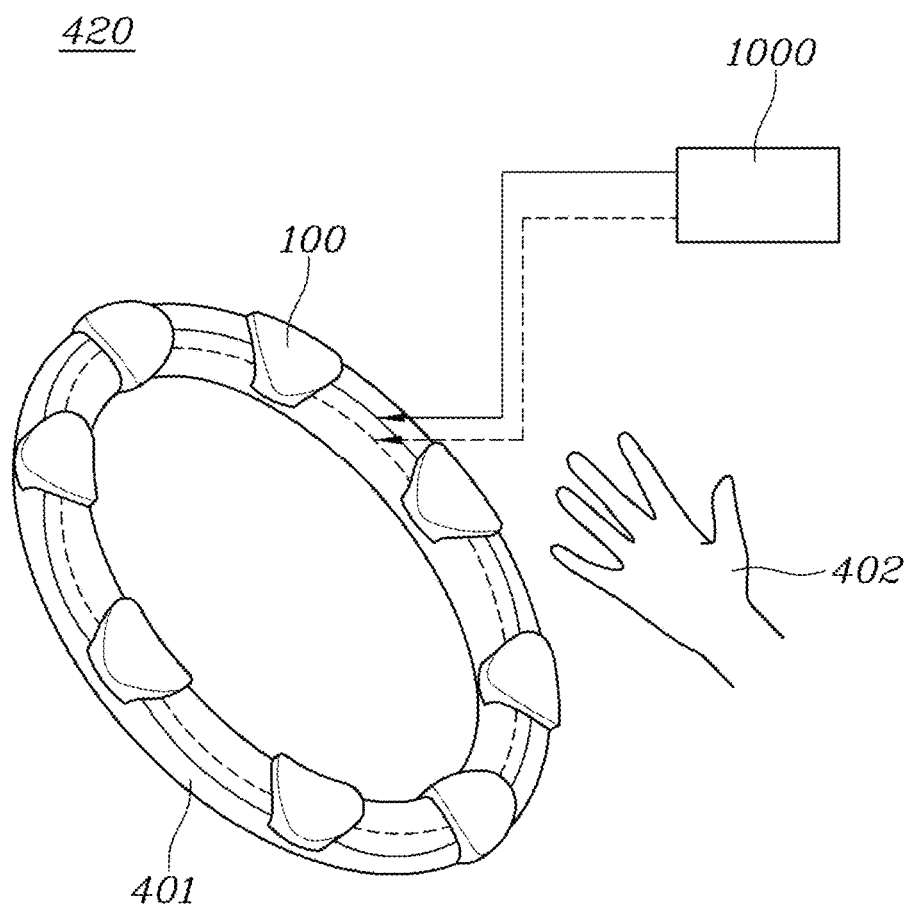
Figure 7:
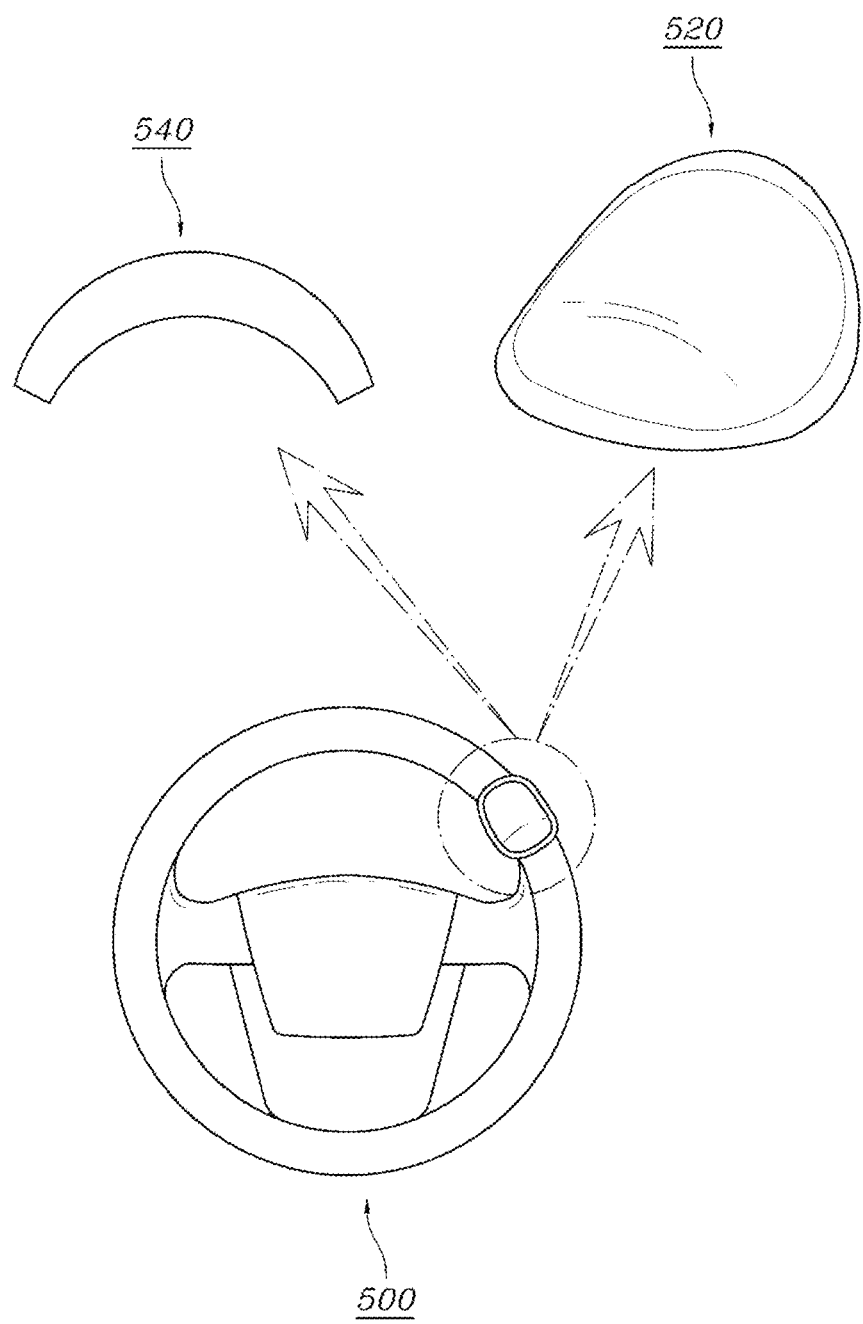
FIG. 7 is a view exemplarily illustrating an example in which the flexible actuator for the curved surfaces is applied to a steering wheel.

FIG. 1 is a cross-sectional view exemplarily illustrating the structure of a flexible actuator for curved surfaces according to an exemplary embodiment of the present disclosure, FIG. 2A and FIG. 2B are conceptual views exemplarily illustrating the operations of the flexible actuator according to an exemplary embodiment of the present disclosure before and after a voltage is applied, FIG. 3 is an enlarged view of the portion "A" in FIG. 2, FIG. 4 is a three-dimensional view exemplarily illustrating operation states before and after power is applied according to an exemplary embodiment of the present disclosure, FIG. 5 is a view exemplarily illustrating the configuration of the flexible actuator for curved surfaces and a control circuit thereof, FIG. 6A and FIG. 6B are conceptual views exemplarily illustrating an exemplary embodiment in which the flexible actuator for curved surfaces is applied to a steering wheel, and FIG. 7 is a view exemplarily illustrating an example in which the flexible actuator for curved surfaces is applied to a steering wheel.

FIG. 1 illustrates the cross-sectional structure of a flexible actuator for curved surfaces 100 according to an exemplary embodiment of the present disclosure and an enlarged view of a portion of the center portion of the flexible actuator.

The flexible actuator 100 for curved surfaces includes a substrate layer 101 having a curved shape, an electroactive polymer composite film 110 covering the substrate layer 101 and having a curved shape, an electrode 103 disposed on the substrate layer 101, a dielectric fluid 102 injected between the electroactive polymer composite film 110 and the electrode 103. Here, the peripheral portions of the electroactive polymer composite film 110 and the substrate layer 101 are joined so that the dielectric fluid 102 does not leak. Although each of the electroactive polymer composite film 110 and the substrate layer 101 is illustrated as having a circular shape having a curved surface in FIG. 1, other shapes, such as a polygonal shape or an elliptical shape, may be used as required.

The substrate layer 101 may maintain the curved shape due to the rigidity thereof, or be flexible to have the curved shape conforming to a contact portion of an object to which the substrate layer 101 is applied. Furthermore, the substrate layer 101 may be formed of a non-conductive material which is non-reactive to either the dielectric fluid 102 or the electroactive polymer composite film 110.

The electroactive polymer composite film 110 includes an electroactive polymer layer 111 formed of an elastic polymer material and a flexible electrode layer 112. Although the flexible electrode layer 112 may be disposed on the outermost portion of the electroactive polymer layer 111, the flexible electrode layer 112 may also be stacked within the electroactive polymer layer 111 when insulation from the external environment is required. However, also in the instant case, the flexible electrode layer 112 may be disposed in the innermost position of the electroactive polymer layer 111 so as not to be in direct contact with the electrode 103 disposed on top of the substrate layer 101. When power is applied in a situation in which the flexible electrode layer 112 and the electrode 103 are in direct contact, a short circuit may occur. The flexible electrode layer 112 may maintain conductivity even when there is a change in the physical shape of the flexible actuator 100 for curved surfaces. The flexible electrode layer 112 may be formed of a variety of conductive materials, such as carbon nano-tube (CNT), metal nano-particles, graphene, a conductive polymer, and hydrogel. Furthermore, either the electroactive polymer layer 111 or the flexible electrode layer 112 may be formed of a transparent material when transparency is required.

The electrode 103 is disposed on the substrate layer 101 to be paired with the flexible electrode layer 112. Here, the electrode 103 may be a flexible electrode 103 in accordance with the degree of flexibility of the substrate layer 101. Furthermore, the distance between the electroactive polymer composite film 110 and the electrode 103 decreases in the direction toward the center portion of the actuator, due to the curvature of the substrate layer 101. In the instant case, both the electroactive polymer composite film 110 and the electrode 103 may be in contact. Thus, a predetermined angle 104 may be defined between the electroactive polymer composite film 110 and the electrode 103. The angle 104 defined in the present manner has a very small value due to the curvature of the substrate layer 101.

FIG. 2A and FIG. 2B are conceptual views exemplarily illustrating the operations of the flexible actuator according to an exemplary embodiment of the present disclosure before and after a voltage is applied.

FIG. 2A illustrates a cross-sectional shape 200 of the flexible actuator 100 for curved surfaces before a voltage is applied, whereas FIG. 2B illustrates a cross-sectional shape 300 of the flexible actuator 100 for curved surfaces after the voltage is applied. Referring to the cross-sectional shape 200 before voltage is applied, the distance between the electroactive polymer composite film 110 and the electrode 103 has a smaller value in the center portion of the actuator than in the peripheral portions of the actuator.

FIG. 2B illustrates the cross-sectional shape 300 of the flexible actuator 100 for curved surfaces after the voltage is applied. In response to the application of the voltage, electrostatic attraction is generated between the flexible electrode layer 112 and the electrode 103 of the electroactive polymer composite film 110. In the instant case, the shorter the distance between the electrodes, the stronger the electrostatic attraction is. Thus, a movement of contacting with the flexible electrode layer 112 and the electrode 103 spreads from the center portion in which the distance between the flexible electrode layer 112 and the electrode 103 is relatively smaller. As the electroactive polymer composite film 110 and the electrode 103 are brought into contact by strong electrostatic attraction in the center portion, the dielectric fluid 102 present therebetween is pushed toward the peripheral portions, changing the physical shape. Due to such changes in the physical shape, the actuator may produce vibration.

FIG. 3 is an enlarged view of the portion "A" in FIG. 2.

FIG. 3 is a cross-sectional view of the enlarged center portion of the flexible actuator 100 for curved surfaces. In an exemplary embodiment of the present disclosure, the electroactive polymer composite film 110 and the electrode 103 are in contact in the center portion to form an initial contact point 105. The initial contact point 105 is a portion in which the contacting movement occurs first when the voltage is applied. The initial contact point 105 may be formed as the distance between the electroactive polymer composite film 110 and the electrode 103 in the center portion is smaller than in the peripheral portions even in the case that the electroactive polymer composite film 110 and the electrode 103 are not in direct contact.

In an exemplary embodiment of the present disclosure, when the power is applied, a positive voltage and a negative voltage may be applied to the flexible electrode layer 112 and the electrode 103, respectively. Although the types of voltage applied to the flexible electrode layer 112 and the electrode 103 may be exchanged, it may be desirable in terms of safety that a ground voltage is applied to the flexible electrode layer 112 and a positive voltage is applied to the electrode 103. In the instant case, a negative charge 113 may be induced to a surface portion of the electroactive polymer layer 111 to be in contact with electrode 103, whereas a positive charge may be induced to a surface portion of the electrode 103 to be in contact with the electroactive polymer composite film 110. Consequently, electrostatic attraction is generated between the electrodes and is greater with decreases in the distance between the electrodes. Accordingly, the contacting movement spreads in the direction of the initial contact point 105 to the peripheral portions of the flexible actuator 100 for curved surfaces. The present contacting movement pushes the dielectric fluid 102 toward the peripheral portions, changing the physical shape of the electroactive polymer composite film 110.

In an exemplary embodiment of the present disclosure, when the power is supplied to change over time, the change of the physical shape of the electroactive polymer composite film 110 varies over time, generating actuation, such as vibration. Here, the magnitude and frequency of the vibration are associated with the magnitude and frequency of the power supplied.

Furthermore, the stronger the electrostatic attraction, the greater the contact area between the electroactive polymer composite film 110 and the electrode 103 may be. The pressure of the dielectric fluid 102 may be increased to generate greater vibration. Here, according to Coulomb's law, electrostatic attraction is produced in inverse proportion to the square of the distance between charges. Thus, as the distance between the negative charge 113 of the electroactive polymer layer 111 and the positive charge on the electrode 103 is smaller, the electrostatic attraction exponentially increases.

As illustrated in FIG. 3, in an exemplary embodiment of the present disclosure, due to the curvature of the substrate layer 101, the angle 104 defined about the initial contact point 105 between the electroactive polymer composite film 110 and the electrode 103 may have a very small value. Thus, the distance between the charge 113 of the electroactive polymer layer 111 and the electrode 103 may be significantly reduced to a very small value. This may generate greater electrostatic attraction, producing high-power vibration.

In an exemplary embodiment in which electrostatic attraction may be increased, a higher voltage may be supplied, or the electroactive polymer layer 111 may be formed of a material having a high dielectric constant so that greater electrostatic attraction may be generated from the same power. In another exemplary embodiment of the present disclosure, an electroactive polymer material capable of easily generating surface charge induction may be used. For example, in the case of PVC gel, as illustrated in FIG. 3, charge may move within the polymer material to reduce the distance from the electrode 103, so that stronger electrostatic attraction may be generated from the same voltage. Furthermore, when the electroactive polymer material is PVA gel, ions may move within the polymer material, increasing electrostatic attraction.

FIG. 4 is a three-dimensional view exemplarily illustrating operation states of the flexible actuator 100 for curved surfaces before and after power is applied according to an exemplary embodiment of the present disclosure. The left portion of the drawing with respect to the arrow in the center portion illustrates a three-dimensional shape 300 before the power is applied, whereas the right portion of the drawing with respect to the arrow in the center portion illustrates a three-dimensional shape 400 after the power is applied. When the power is applied, a contacting movement spreads in the direction from a center portion 4b to the peripheral portions due to electrostatic attraction. Consequently, the dielectric fluid is pushed toward the peripheral portions, inflating the peripheral portions 4a of the actuator. Here, when the peripheral portions 4a of the actuator are in contact with the skin of a user, the user may feel expanding force and vibration.

FIG. 5 is a view exemplarily illustrating the configuration of the flexible actuator 100 for curved surfaces and a control circuit 1000 thereof. Referring to FIG. 5, the control circuit 1000 may include a power supply portion 1001, a high voltage converter 1002, a high voltage switching element 1003, and a microcontroller 1004.

The controller according to various exemplary embodiments of the present disclosure may be realized by a non-volatile memory and a processor, wherein the memory stores data regarding an algorithm configured to control the operations of a variety of components of a vehicle or software instructions for realizing the algorithm, and the processor is configured to perform the following operations using the data stored in the memory. Here, the memory and the processor may be implemented as chips, respectively. Alternatively, the memory and the processor may be implemented as a single integrated chip, and the processor may be one or more processors.

The power supply portion 1001 is a circuit supplying a low-voltage DC current necessary for the control circuit 1000. In an exemplary embodiment of the present disclosure, the power supply portion 1001 may use a voltage in the range of from 12 V to 24 V.

The high voltage converter 1002 is configured to convert the low-voltage DC current supplied from the power supply portion 1001 into a high-voltage DC current to drive the actuator. For sufficient drive power, conversion into a high voltage current in the range of from 2000 V to 6000 V may be necessary.

The high voltage switching element 1003 switches a high-voltage current signal at a rate of several ms using an optical element or the like, so that the flexible actuator 100 for curved surfaces may be rapidly contracted and expanded.

Here, the microcontroller 1004 selects a target signal at a micro-current level, so that the high voltage switching element 1003 switches a high-voltage current signal in response to the corresponding signal.

The negative electrode and the positive electrode of the power supply portion 1001 are connected sequentially to the high voltage converter 1002 and the high voltage switching element 1003 and then to the flexible electrode layer 112 and the electrode 103 through cables 1005 and 1006. The cable 1005 connected to the negative electrode of the power supply portion 1001 is connected to the flexible electrode layer 112 of the electroactive polymer composite film 110, and the cable 1006 connected to the positive electrode is connected to the electrode 103. Here, the cables connected to the electrodes may be exchanged, but such an exchange is not desirable in terms of safety.

FIG. 6A and FIG. 6B are conceptual views exemplarily illustrating an exemplary embodiment in which the flexible actuator 100 for curved surfaces is applied to a steering wheel.

FIG. 6A illustrates a cross-sectional shape in which the flexible actuator 100 for curved surfaces is attached to the surface of a steering wheel 401 of a vehicle.

FIG. 6B illustrates an exemplary embodiment in which the flexible actuator 100 for curved surfaces is disposed on the steering wheel 401 of a vehicle. In the instant case, a plurality of flexible actuators 100 may be disposed on the entire steering wheel 401 while being regularly spaced from each other. The substrate layer 101 of the actuator may have a shape conforming to the curvature of the steering wheel 401 of the vehicle and be fabricated sufficiently thin. Furthermore, the substrate layer 101 may be formed of a flexible material so that a user may not have a foreign body feeling or an uncomfortable feeling from the steering wheel 401. In an exemplary embodiment of the present disclosure, when the flexible actuator 100 is applied to the steering wheel 401, the flexible actuator 100 may generate vibration signals conveying various types of information, such as a warning, guidance, or direction, to the user.

FIG. 7 is a view exemplarily illustrating an example shape of the flexible actuator 100 for curved surfaces, the flexible actuator 100 being fabricated to conform to a steering wheel. FIG. 7 illustrates a front shape 500 of the steering wheel 401 to which the flexible actuator 100 for curved surfaces is attached and a side shape 540 and a three-dimensional shape 420 of the flexible actuator 100 for curved surfaces.

Furthermore, the term related to a control device such as "controller", "control apparatus", "control unit", "control device", "control module", or "server", etc refers to a hardware device including a memory and a processor configured to execute one or more steps interpreted as an algorithm structure. The memory stores algorithm steps, and the processor executes the algorithm steps to perform one or more processes of a method in accordance with various exemplary embodiments of the present disclosure. The control device according to exemplary embodiments of the present disclosure may be implemented through a nonvolatile memory configured to store algorithms for controlling operation of various components of a vehicle or data about software commands for executing the algorithms, and a processor configured to perform operation to be described above using the data stored in the memory. The memory and the processor may be individual chips. Alternatively, the memory and the processor may be integrated in a single chip. The processor may be implemented as one or more processors. The processor may include various logic circuits and operation circuits, may process data according to a program provided from the memory, and may generate a control signal according to the processing result.

The control device may be at least one microprocessor operated by a predetermined program which may include a series of commands for carrying out the method included in the aforementioned various exemplary embodiments of the present disclosure.

The aforementioned invention can also be embodied as computer readable codes on a computer readable recording medium. The computer readable recording medium is any data storage device that can store data which may be thereafter read by a computer system and store and execute program instructions which may be thereafter read by a computer system. Examples of the computer readable recording medium include Hard Disk Drive (HDD), solid state disk (SSD), silicon disk drive (SDD), read-only memory (ROM), random-access memory (RAM), CD-ROMs, magnetic tapes, floppy discs, optical data storage devices, etc and implementation as carrier waves (e.g., transmission over the Internet). Examples of the program instruction include machine language code such as those generated by a compiler, as well as high-level language code which may be executed by a computer using an interpreter or the like.

In various exemplary embodiments of the present disclosure, each operation described above may be performed by a control device, and the control device may be configured by a plurality of control devices, or an integrated single control device.

In various exemplary embodiments of the present disclosure, the control device may be implemented in a form of hardware or software, or may be implemented in a combination of hardware and software.

Furthermore, the terms such as "unit", "module", etc. Included in the specification mean units for processing at least one function or operation, which may be implemented by hardware, software, or a combination thereof.

For convenience in explanation and accurate definition in the appended claims, the terms "upper", "lower", "inner", "outer", "up", "down", "upwards", "downwards", "front", "rear", "back", "inside", "outside", "inwardly", "outwardly", "interior", "exterior", "internal", "external", "forwards", and "backwards" are used to describe features of the exemplary embodiments with reference to the positions of such features as displayed in the figures. It will be further understood that the term "connect" or its derivatives refer both to direct and indirect connection.

The foregoing descriptions of specific exemplary embodiments of the present disclosure have been presented for purposes of illustration and description. They are not intended to be exhaustive or to limit the present disclosure to the precise forms disclosed, and obviously many modifications and variations are possible in light of the above teachings. The exemplary embodiments were chosen and described to explain certain principles of the present disclosure and their practical application, to enable others skilled in the art to make and utilize various exemplary embodiments of the present disclosure, as well as various alternatives and modifications thereof. It is intended that the scope of the present disclosure be defined by the Claims appended hereto and their equivalents.

What is claimed is:

1. A flexible actuator for curved surfaces, the flexible actuator comprising:
 a substrate layer having a curved shape;
 an electroactive polymer composite film covering the substrate layer and having a curved shape, wherein peripheral portions of the electroactive polymer composite film are joined with peripheral portions of the substrate layer, and the electroactive polymer composite film includes an electroactive polymer layer and a flexible electrode layer;
 an electrode disposed between the substrate layer and the electroactive polymer composite film; and
 a dielectric fluid injected between the electroactive polymer composite film and the electrode,
 wherein the electroactive polymer composite film and the electrode are configured so that a distance between center portions of the electroactive polymer composite film and the electrode is smaller than a distance between the peripheral portions of the electroactive polymer composite film and peripheral portions of the electrode.

2. The flexible actuator of claim 1, wherein the electroactive polymer composite film is configured to change a physical shape thereof by pushing the dielectric fluid in a direction toward the peripheral portions of the electroactive polymer composite film as the flexible electrode layer and the electrode are brought into contact in a direction from the center portions to the peripheral portions of the flexible electrode layer and the electrode due to electrostatic attraction between the flexible electrode layer and the electrode when a voltage is applied thereto.

3. The flexible actuator of claim 1, wherein the electroactive polymer composite film and the electrode define a predetermined angle therebetween from the center portions, the angle being minimized by a curvature of the substrate layer.

4. The flexible actuator of claim 1, wherein the electroactive polymer composite film includes a material generating surface charge induction to improve electrostatic attraction.

5. The flexible actuator of claim 1, wherein the electrode includes a flexible electrode depending on a degree of flexibility of the substrate layer.

6. The flexible actuator of claim 1, wherein the flexible electrode layer is internally disposed within a body of the electroactive polymer layer to be insulated from an external environment.

7. The flexible actuator of claim 1, further including a control circuit, wherein the control circuit includes:
 a power supply portion;
 a high voltage converter configured for converting a current into a current having a voltage higher than a predetermined voltage;
 a controller configured for selecting a target signal at a predetermined current level; and
 a high voltage switching element configured for switching a high-voltage current signal at a rate of microseconds in response to the target signal, wherein a negative electrode and a positive electrode of the power supply portion are connected sequentially to the high voltage converter and the high voltage switching element and then to the flexible electrode layer and the electrode through corresponding cables.

8. A computer-readable recording medium in which a program for controlling the flexible actuator of claim 7 for the curved surfaces is recorded, the recording medium storing a program to implement a function of:
   switching, by the high-voltage switching element of the control circuit, the high-voltage current signal to the target signal selected by the controller, allowing the electroactive polymer composite film to be contracted or expanded.

9. The flexible actuator of claim 1, wherein the flexible actuator for the curved surfaces is applied to a steering wheel.

10. The flexible actuator of claim 9, wherein the flexible actuator for the curved surfaces is attached to a surface of the steering wheel and is configured to generate vibration signals for conveying information to a user.

11. A method of controlling a flexible actuator for curved surfaces, the method comprising:
   generating electrostatic attraction between a flexible electrode layer of an electroactive polymer composite film and an electrode when power is supplied thereto; and
   pushing a dielectric fluid toward peripheral portions of the electroactive polymer composite film and the electrode, for changing a physical shape of the electroactive polymer composite film, as contact between the electroactive polymer composite film and the electrode spreads in a direction from center portions of the electroactive polymer composite film and the electrode to the peripheral portions of the electroactive polymer composite film and the electrode,
   wherein the generation of the electrostatic attraction includes forming a predetermined angle between the electroactive polymer composite film and the electrode at the center portions, and
   wherein the angle is minimized due to a curvature of a substrate layer, and the electrostatic attraction is increased with decreases in a distance between the flexible electrode layer and the electrode.

12. The method of claim 11, wherein the generation of the electrostatic attraction includes increasing the electrostatic attraction by forming the electroactive polymer composite film of a material capable of generating surface charge induction.

13. The method of claim 11, further including generating vibration supplying power that varies over time.

14. The method of claim 13, wherein the generation of the electrostatic attraction includes:
   switching, by a high-voltage switching element of a control circuit connected to the flexible electrode layer and the electrode, a current signal which has a voltage higher than a predetermined voltage to a target signal selected by a controller, allowing the electroactive polymer composite film to be contracted or expanded.

* * * * *